US012603584B1

(12) United States Patent
Castelaz

(10) Patent No.: US 12,603,584 B1
(45) Date of Patent: Apr. 14, 2026

(54) INTEGRATED POWER HUB

(71) Applicant: Motiv Power Systems, Inc., Foster City, CA (US)

(72) Inventor: James Michael Castelaz, Alameda, CA (US)

(73) Assignee: Motiv Power Systems, Inc., Foster City, CA (US)

( * ) Notice: Subject to any disclaimer, the term of this patent is extended or adjusted under 35 U.S.C. 154(b) by 259 days.

(21) Appl. No.: 18/378,626

(22) Filed: Oct. 10, 2023

Related U.S. Application Data

(60) Provisional application No. 63/378,810, filed on Oct. 7, 2022.

(51) Int. Cl.
 H02M 7/00 (2006.01)
 H02J 3/36 (2006.01)
 H05K 7/20 (2006.01)
(52) U.S. Cl.
 CPC .............. H02M 7/003 (2013.01); H02J 3/36 (2013.01); H05K 7/20927 (2013.01)
(58) Field of Classification Search
 CPC ...... H02M 7/003; H02M 7/53871; H02J 3/36; H02J 7/00; H02J 7/0019; H02J 7/0024; H02J 7/0042; H02J 7/0045; H05K 7/20927; H02H 7/00; H02H 7/10; H02H 7/22; H02H 7/26; H02H 3/025; H02H 3/044; H02H 9/02; H01M 10/44; H01M 10/613; H01M 10/625; H01M 10/633;

H01M 10/6568–6569; H01M 2220/20; H01M 2220/425; H01M 2010/4271; G06F 1/263; H01H 3/6606
See application file for complete search history.

(56) References Cited

U.S. PATENT DOCUMENTS

| | | | | | |
|---|---|---|---|---|---|
| 8,737,096 | B2 * | 5/2014 | Asplund | ................... | H02J 3/36 |
| | | | | | 363/35 |
| 11,843,242 | B1 * | 12/2023 | Gharpurey | ............. | H02H 7/268 |
| 2007/0114954 | A1 * | 5/2007 | Hampo | ................... | B60L 3/003 |
| | | | | | 318/105 |
| 2015/0349655 | A1 * | 12/2015 | Petersen | ............... | H02M 5/458 |
| | | | | | 363/35 |
| 2020/0282853 | A1 * | 9/2020 | Paryani | ................... | B60L 53/22 |
| 2020/0382041 | A1 * | 12/2020 | Abdelli | ................. | B64D 31/00 |
| 2020/0395758 | A1 * | 12/2020 | Tanaka | ...................... | H02J 3/38 |

* cited by examiner

*Primary Examiner* — Amir A Jalali
(74) *Attorney, Agent, or Firm* — Adibi IP Group, PC; Amir V. Adibi; Andrew C. Palmer

(57) ABSTRACT

An integrated power hub operates to distribute power in electric vehicles. In one embodiment, the power hub includes a first power converter that converts power between an AC voltage network and a high voltage direct current (HVDC) bus, a second power converter that converts power between the HVDC bus and a low voltage DC (LVDC) bus, a first HVDC connector mounted to the enclosure that is connected to the HVDC bus, a second HVDC connector mounted to the enclosure that is connected to the HVDC bus through a switch, a third HVDC connector mounted to the enclosure that is connected to the HVDC bus through a current-limiting device, and a first LVDC connector mounted to the enclosure that is connected to the LVDC bus.

18 Claims, 7 Drawing Sheets

FRONT VIEW

REAR VIEW

500

| REF# | NAME | DESCRIPTION |
|------|------|-------------|
| AC | AC input | AC INPUT CONNECTOR |
| C1 | HVDC | HV HIGH CURRENT BUS |
| C2 | DCFC | HVDC CONNECT TO CHARGING STA. |
| C3A-E | HVLC | HV LOW CURRENT BUS |
| C4 | 12V OUT | 12 VOLT BATTERY |
| C4R | 12V RET | 12 VOLT RETURN |
| 316 | SYSTEM 1 | FIRST SYSTEM CONNECTOR |
| 318 | SYSTEM 2 | SECOND SYSTEM CONNECTOR |
| 322 | MOTOR | MOTOR PWR/CTL CONNECTOR |

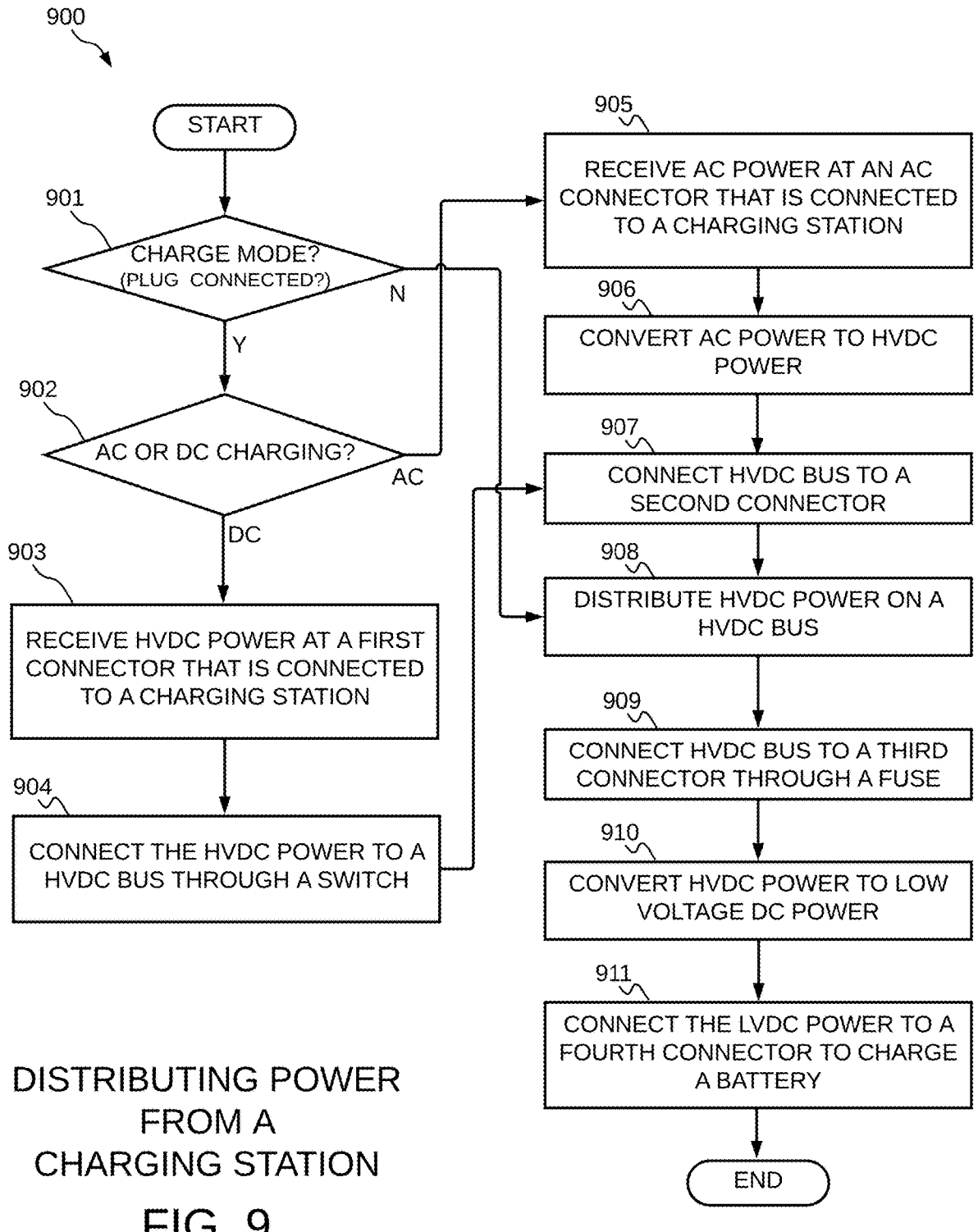

900

START

901

CHARGE MODE?
(PLUG CONNECTED?)

N

Y

905

RECEIVE AC POWER AT AN AC
CONNECTOR THAT IS CONNECTED
TO A CHARGING STATION

906

CONVERT AC POWER TO HVDC
POWER

902

AC OR DC CHARGING?

AC

DC

907

CONNECT HVDC BUS TO A
SECOND CONNECTOR

908

DISTRIBUTE HVDC POWER ON A
HVDC BUS

903

RECEIVE HVDC POWER AT A FIRST
CONNECTOR THAT IS CONNECTED
TO A CHARGING STATION

909

CONNECT HVDC BUS TO A THIRD
CONNECTOR THROUGH A FUSE

910

CONVERT HVDC POWER TO LOW
VOLTAGE DC POWER

904

CONNECT THE HVDC POWER TO A
HVDC BUS THROUGH A SWITCH

911

CONNECT THE LVDC POWER TO A
FOURTH CONNECTOR TO CHARGE
A BATTERY

END

DISTRIBUTING POWER
FROM A
CHARGING STATION

FIG. 9

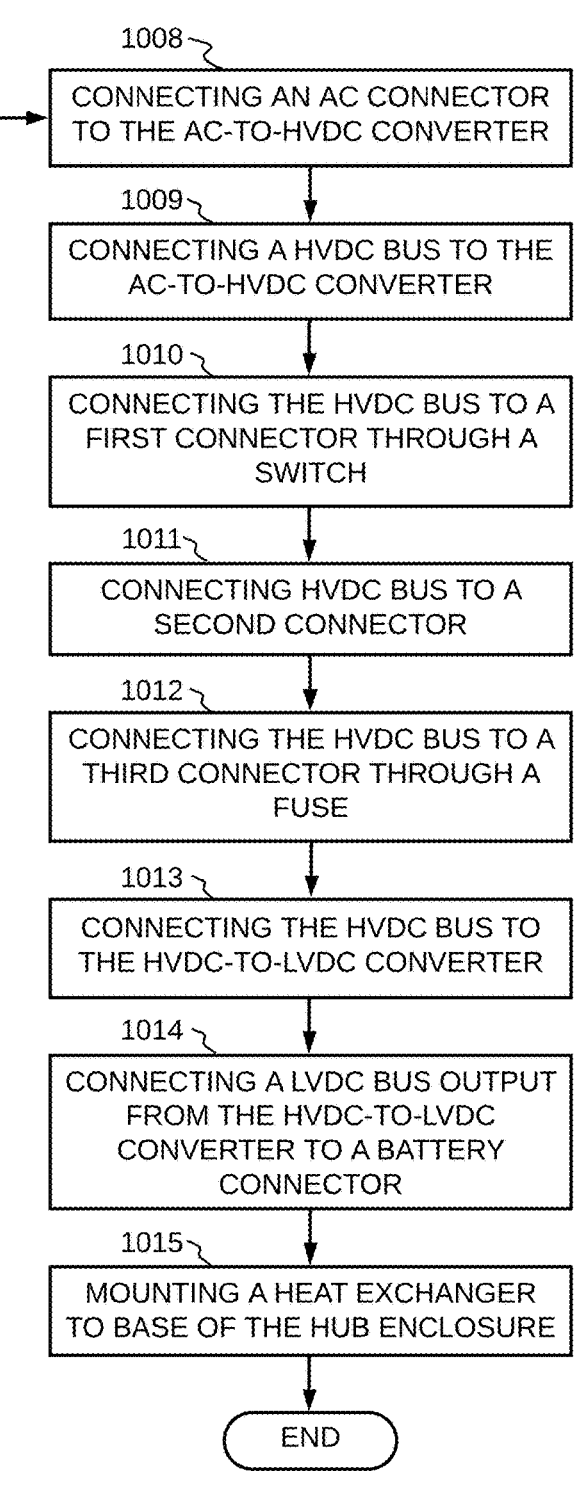

1000

START

1001 — FORMING A HUB ENCLOSURE

1002 — MOUNTING CONNECTORS TO THE HUB ENCLOSURE

1003 — MOUNTING AN AC-TO-HVDC CONVERTER TO THE BASE OF THE HUB ENCLOSURE

1004 — MOUNTING A HVDC-TO-LVDC CONVERTER TO THE BASE OF THE HUB ENCLOSURE

1005 — MOUNTING A MAIN PCB ON TOP OF THE TWO CONVERTERS USING CONDUCTIVE STANDOFFS THAT PASS CONTROL SIGNALS

1006 — MOUNTING A MOTOR CONTROL BOARD ON TOP OF THE MAIN PCB

1007 — MOUNTING A CONTROL BOARD WITHIN THE HUB ENCLOSURE AND PERPENDICULAR TO THE MAIN PCB

1008 — CONNECTING AN AC CONNECTOR TO THE AC-TO-HVDC CONVERTER

1009 — CONNECTING A HVDC BUS TO THE AC-TO-HVDC CONVERTER

1010 — CONNECTING THE HVDC BUS TO A FIRST CONNECTOR THROUGH A SWITCH

1011 — CONNECTING HVDC BUS TO A SECOND CONNECTOR

1012 — CONNECTING THE HVDC BUS TO A THIRD CONNECTOR THROUGH A FUSE

1013 — CONNECTING THE HVDC BUS TO THE HVDC-TO-LVDC CONVERTER

1014 — CONNECTING A LVDC BUS OUTPUT FROM THE HVDC-TO-LVDC CONVERTER TO A BATTERY CONNECTOR

1015 — MOUNTING A HEAT EXCHANGER TO BASE OF THE HUB ENCLOSURE

END

FORMING A POWER DISTRIBUTION HUB

FIG. 10

INTEGRATED POWER HUB

CROSS REFERENCE TO RELATED APPLICATIONS

This application claims the benefit under 35 U.S.C. § 119 from U.S. Provisional Patent Application Ser. No. 63/378, 810, entitled "Integrated Power Hub," filed on Oct. 7, 2022, the subject matter of which is expressly incorporated herein by reference.

TECHNICAL FIELD

The present invention relates generally to electric vehicles, and more specifically, to an integrated power hub for power distribution in electric vehicles.

BACKGROUND INFORMATION

Electric vehicles utilize a variety of electrical systems for control and operation. Each one of these systems requires power that is derived from one or more vehicle batteries. A power distribution system is used to distribute battery power throughout the vehicle. Power distribution systems play an important role in determining vehicle operation and cost.

SUMMARY

An integrated power hub operates to distribute power in electric vehicles. In one embodiment, the power hub includes a first power converter that converts power between an AC voltage network and a high voltage direct current (HVDC) bus, a second power converter that converts power between the HVDC bus and a low voltage DC (LVDC) bus, a first HVDC connector mounted to the enclosure that is connected to the HVDC bus, a second HVDC connector mounted to the enclosure that is connected to the HVDC bus through a switch, a third HVDC connector mounted to the enclosure that is connected to the HVDC bus through a current-limiting device, and a first LVDC connector mounted to the enclosure that is connected to the LVDC bus.

In another embodiment, a method is provided that comprises controlling a first power converter to convert power between an AC voltage connector and a first high-voltage DC (HVDC) connector. The first power converter is enclosed within an enclosure. The method also comprises controlling a second power converter to convert power between the first HVDC connector and a low-voltage DC (LVDC) connector. The second power converter is enclosed within the enclosure. The method also comprises controlling a switch to allow power flow between the first HVDC connector and a second HVDC connector.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 9 is a flowchart of a method in accordance with at least one novel aspect.

FIG. 10 is a flowchart of a method in accordance with another novel aspect.

DETAILED DESCRIPTION

Reference will now be made in detail to some embodiments of the invention, examples of which are illustrated in the accompanying drawings.

Figure 1:
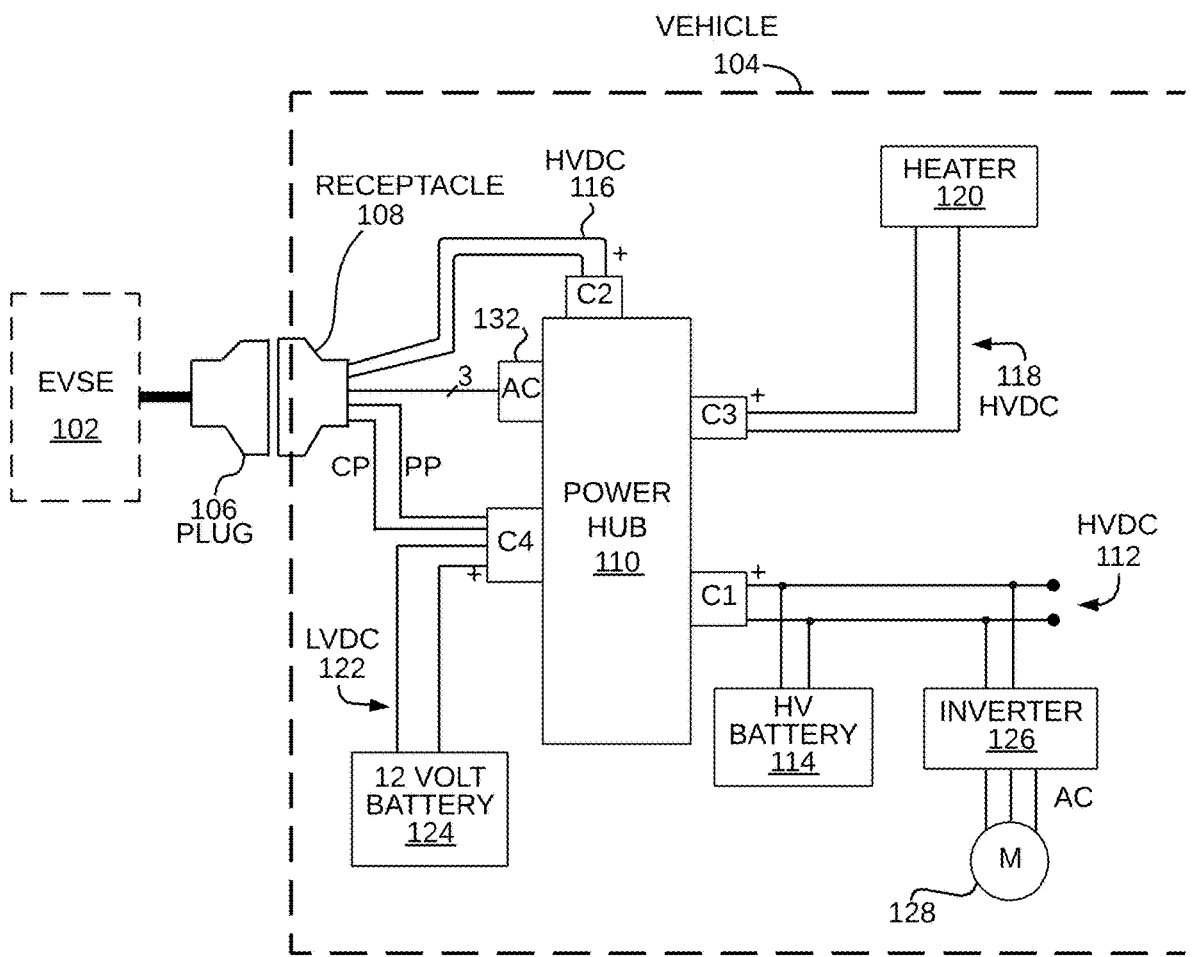
FIG. 1 is a diagram of an embodiment of an integrated power hub for use in a vehicle.

FIG. 1 is a diagram of an integrated power hub 110 for use in a vehicle 104 in accordance with one embodiment. The vehicle 104 is connected to a charging station (or Electric Vehicle Supply Equipment, or EVSE) 102 using plug 106 and receptacle 108. The receptacle 108 provides Alternating Current (AC) power signals to an AC connector 132 of the power hub 110. The AC power signals originate at the charging station 102. The charging station also provides control pilot (CP) and proximity detection (PP) signals as defined in the SAE J1772 standard that control the distribution of power to the vehicle 104.

During operation, the power hub 110 converts the AC power signals to high voltage (HV) and low voltage (LV) direct current (DC) signals that are distributed to various systems of the vehicle 104.

The power hub 110 generates or receives a first HVDC voltage that is provided to the vehicle 104 on HVDC bus 112 through connector (C1). In one embodiment, the connector C1 has High Voltage Interlock (HVIL) functionality for safety. For example, the HVDC bus 112 is coupled to a high voltage battery 114 and an inverter 126. The inverter converts the HVDC voltage on the bus 112 to an AC voltage that is used to drive a motor 128 of the vehicle 104.

The power hub 110 generates or receives a second HVDC voltage that is provided to the receptacle 108 on HVDC bus 116 through connector (C2). In one embodiment, the connector C2 has High Voltage Interlock (HVIL) functionality for safety.

The power hub 110 generates a third HVDC voltage that is provided to the vehicle 104 on HVDC bus 118 through connector (C3). Connector C3 may be selected for lower operating current levels than connectors C1 or C2 and thus may be smaller, lighter, and less expensive. For example, the HVDC bus 118 is coupled to vehicle accessories, such as heater 120. In one embodiment, the HVDC bus 118 has current-limiting protection. Current-limiting protection may be used to protect wires connecting to connector C3, which may be of a smaller cross-sectional size than wires connected to connectors C1 or C2.

The power hub 110 generates a LVDC voltage that is provided to the vehicle 104 on LVDC bus 122 through connector (C4). Connector C4 operates at a lower voltage than connectors C1, C2, and C3 and may not have High Voltage Interlock functionality, and/or may have less terminal-to-terminal spacing. For example, the LVDC bus 122 is coupled to a 12-volt battery 124 of the vehicle 104. Also, the CP and PP signals from the EVSE 102 are input to the power hub 110 through the connector C4. A more detailed description of the power hub 110 is provided below.

Figure 2:
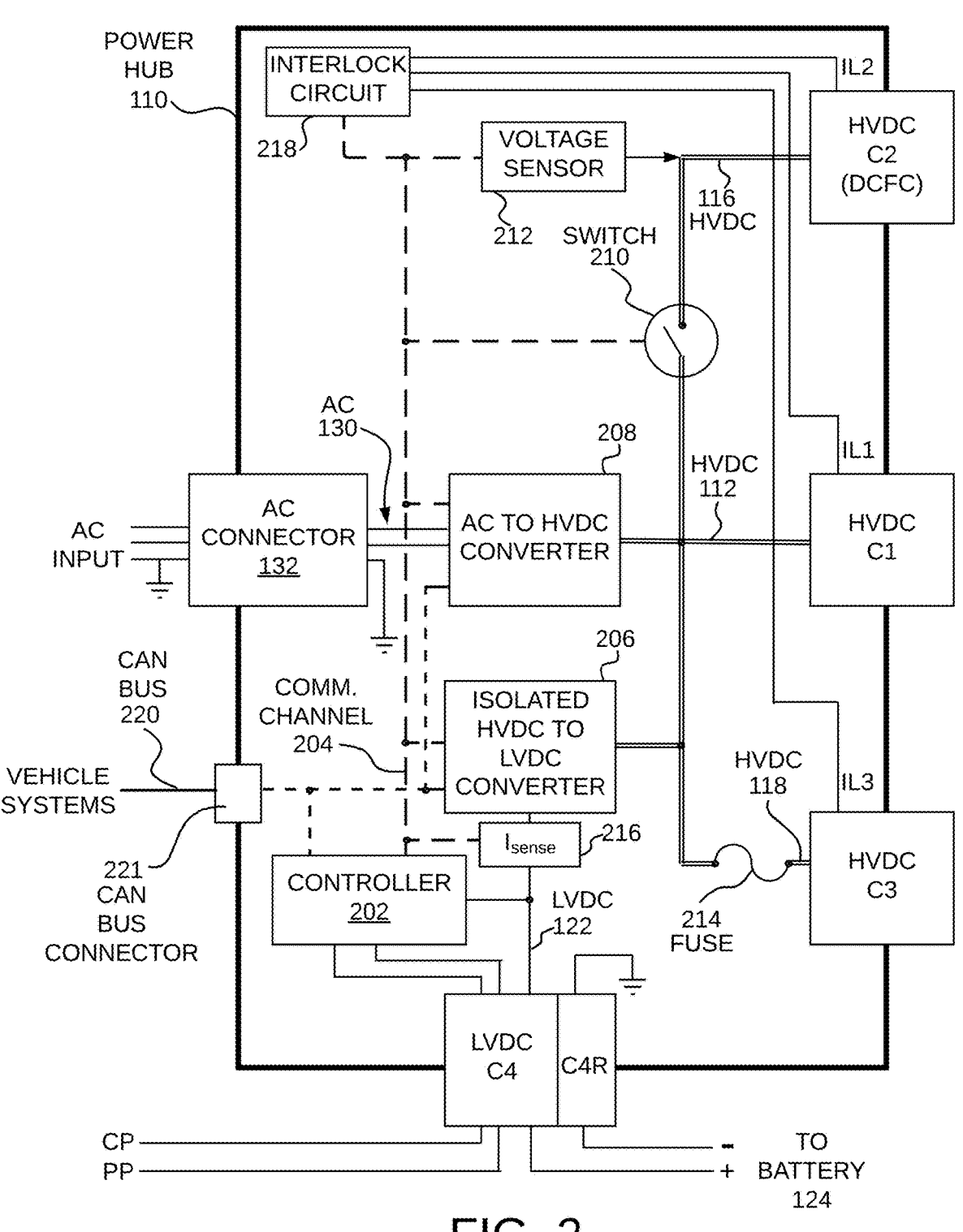
FIG. 2 is a detailed block diagram of the integrated power hub shown in FIG. 1.

FIG. 2 is a detailed block diagram of the integrated power hub 110. As illustrated in FIG. 2, the power hub 110 comprises the AC connector 132 and the connectors C1-C4. The integrated power hub 110 comprises internal circuitry that receives AC power 130 from the AC connector and uses the AC power to generate HVDC power.

In one embodiment, the AC connector 132 comprises an Amphenol HVSLS600 type connector, the HV connector C1 comprises a TE HD1000 series type connector, the HV connector C2 comprises an Amphenol HVSL1000 type connector, the HV connector C3 comprises a TE HVA280 series type connector or an Aptiv HV280 series type connector, the LV connector C4 comprises a TE Leavyseal type connector, and the +12 volt and ground connectors C4R comprise Radlok 8 mm and 10 mm type connectors.

In an embodiment, the internal circuitry comprises AC-to-HVDC power converter 208, isolated HVDC-to-LVDC power converter 206, switch 210, voltage sensor 212, and fuse 214. The internal circuitry also comprises a controller 202 that communicates and/or controls various internal circuitry using a communication channel 204. In one embodiment, the communication channel 204 is a Controller Area Network (CAN) bus. In an alternative embodiment, the communication channel 204 is an analog voltage channel or a digital channel. In one embodiment, a separate CAN BUS 220 is implemented that provides communication between the controller 202, converter 208, converter 206, and vehicle devices or systems external to the power hub 110. For example, in one embodiment, the hub 110 includes a CAN bus connector 221 that allows an external CAN bus to be connected to the hub 110. Thus, multiple communication buses can be implemented to provide communication within the power hub 110 and to external systems outside the power hub 110.

The AC-to-HVDC power converter 208 converts the received AC power to the HVDC voltage that is provided on the HVDC bus 112. In one embodiment, the converter 208, which converts AC to HVDC can be referred to as an Onboard Charger or "OBC" that is configured as a 2-stage converter (e.g., a Totem pole PFC and then a Dual Active Bridge or CLLLC DCDC). It should be noted that other converter topologies can be used. In one embodiment, the received AC power is typically 208 VAC or in the range of 220-240 VAC. In another embodiment, the received AC power is approximately 277 VAC, which is the phase-to-neutral voltage in a 3-phase 480 VAC system.

In one embodiment, HVDC bus 112 operates at a voltage level over 60V, for example, in a range of 320 to 410 volts or in a range of 650 to 830 volts. The connector C1 provides the voltage on the HVDC bus 112 to vehicle systems that are external to the power hub 110.

The HVDC bus 112 is coupled through a switch 210 to the HVDC bus 116. The connector C2 provides the voltage on the HVDC bus 116 to vehicle systems that are external to the power hub 110. In one embodiment, the switch 210 comprises a contactor or a transistor.

In one embodiment, the connector C2 is used to provide a DC fast charge (DCFC) function when the charging station 102 supplies DC power to the vehicle. A voltage sensor 212 monitors the voltage levels on the HVDC bus 116 and provides voltage readings to the controller 202 using the communication channel 204. The controller 202 operates to close or open the switch 210, which connects or disconnects the HVDC bus 112 to/from the HVDC bus 116.

The voltage on the HVDC bus 112 flows through the fuse 214 to produce a fuse protected voltage on the HVDC bus 118. The fuse 214 is rated for a current lower than the current level that would damage connector C3. The fuse 214 provides protection so that if the wires output from the connector C3 become shorted (for example, in the event of a vehicle accident) the connector C3 will not get damaged. When using the HV280 or HVA280 series connector types mentioned above, the max current those connectors can handle is in the range of 30-40 amps, so the fuse 214 is set to 40 amps or less. The fuse 214 can be set to less than 30 amps if the load connected to the connector C3 is small.

The connector C3 provides the voltage on the HVDC bus 118 to vehicle systems that are external to the power hub 110. The fuse 214 operates to limit the current that flows on the HVDC bus 118. In one embodiment, the fuse 214 comprises an eFuse, a switch, or a solid-state device. Thus, the fuse 214 operates as a current-limiting device which protects smaller wires connected to connector C3 from being damaged in an overcurrent fault. While wires connected to connectors C1 and C2 may need to be sized to at least a cross-sectional area so as to be protected by other upstream current-limiting devices not in the power hub 110, such as a fuse inside the battery 114, the wires connected to connector C3 can be smaller, which decreases their cost, weight, and allowable bending radius.

The voltage on the HVDC bus 112 flows to the isolated HVDC-to-LVDC power converter 206, which generates a LVDC voltage on the LVDC bus 122. In one embodiment, the power converter 206 is configured in a dual active bridge configuration, however, other topologies can be used. In one embodiment, LVDC bus 122 operates at a voltage level under 60V, such as 12 volts, 24 volts, or 48 volts. The connector C4 provides the LVDC bus 122 and low-voltage power to vehicle systems that are external to the power hub 110. In one embodiment, the connector C4 comprises many individual wires each providing low-voltage power to different vehicle power loads. In another embodiment, the connector C4 comprises two high-current connections which are routed to the positive and negative terminals of a low-voltage battery (C4 and C4R) such as a 12V battery 124. For example, the connector C4 connects the LVDC bus 122 to a 12V battery 124 positive terminal, and the connector C4R connects to a 12V battery 124 negative terminal in order to monitor the current flowing through the vehicle battery. In one embodiment, the connector C4 routes the CP and PP signals from the EVSE 102 to the controller 202. The controller 202 is also connected to receive LVDC power from the LVDC bus 122.

In one embodiment, the power hub 110 comprises a current sense ($I_{sense}$) circuit 216 that is configured to measure current flowing through a connection of the LVDC bus 122. The $I_{sense}$ circuit 216 is coupled to the communication channel 204 and uses this channel to communicate current measurements to the controller 202.

In one embodiment, the power hub 110 comprises an interlock circuit 218 that is configured to detect whether or not one or more of the connectors C1, C2, and C3 is connected or disconnected to an external device. The interlock circuit 218 receives interlock signals (IL1, IL2, and IL3) that indicate when the connectors C1, C2, and C3 are connected. The interlock circuit 218 interprets the interlock signals IL1, IL2, and IL3 to generate an interlock status for each connector or a combined interlock status for all connectors. For example, a combined interlock status might have one logic state if any connector is disconnected and a second logic state if all connectors are connected. The interlock circuit 218 is connected to the communication bus 204 and transmits the interlock status of each connector and/or the combined interlock status of all connectors to the controller 202.

In one embodiment, the power hub 110 comprises a bleed-down circuit, which can be activated to reduce the voltage on the HVDC bus 112. Frequently, power converters such as the AC-to-HVDC power converter 208 and isolated HVDC-to-LVDC power converter 206 may contain capacitance on their HVDC input or output. If an HVDC connector C1-C3 on the power hub 110 becomes disconnected while there is voltage on the HVDC bus 112, then the bleed-down circuit may be activated by the interlock circuit 218 or by the controller 202. The interlock circuit 218 or controller 202 may also cause the source of voltage on the HVDC bus 112 to disconnect or power down, for example by opening battery contactors or commanding the AC-to-HVDC converter 208 to turn off. When activated, the bleed-down circuit may connect a means of power removal to the HVDC bus 112 thereby reducing the voltage accessible on the disconnected connector to a safer, lower voltage level, such as under 60 volts. In one embodiment, the HVDC-to-LVDC power converter 206 functions as a bleed-down circuit. In another embodiment, a resistor or other power dissipation element is connected across the HVDC bus 112 to serve as a bleed-down circuit. Alternatively, both the HVDC-to-LVDC power converter 206 and a resistor are used together as a bleed-down circuit.

In one embodiment, each of the connectors C1 and C2 sustains a current level that is at least twice as large as a current level sustained by the connector C3. In one embodiment, the connector C1 carries at least 100 amperes, the connector C2 carries at least 200 amperes, and the connector C3 carries less than 50 amperes.

Figures 3, 4:
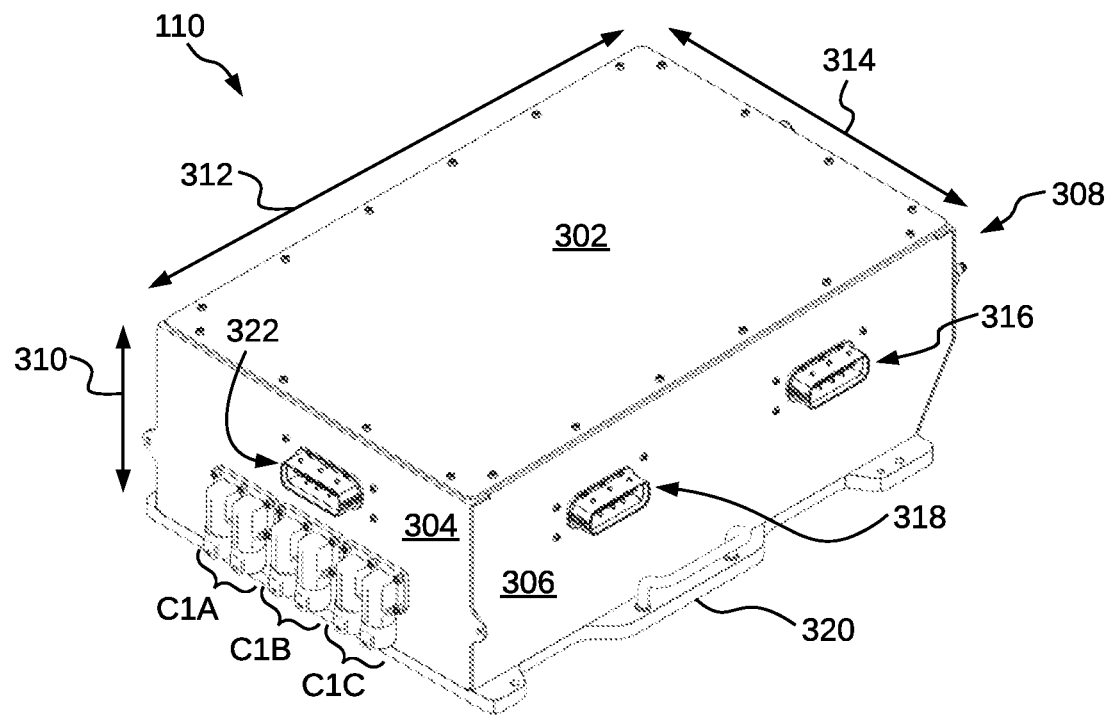
FIG. 3 is a diagram showing a front view of an integrated power hub.
FIG. 4 is a diagram showing a rear view of an integrated power hub.

FIG. 3 is a diagram showing a front view of the integrated power hub 110. In one embodiment, the power hub 110 comprises an enclosure having a top surface 302, front surface 304, a right side surface 306, and a rear surface 308 that is not visible in the front view. In an embodiment, the power hub 110 has a height 310 of approximately 9.65 inches, a length 312 of approximately 28.85 inches, and a width 314 of approximately 20.4 inches. In one embodiment, the total weight of the power hub 110 is approximately 85 pounds. The power hub 110 is made of metal and uses gaskets or other sealing mechanisms to provide a waterproof enclosure. For example, the power hub 110 is designed to provide an ingress protection (IP) rating that is greater than IP22. In one embodiment, the power hub 110 contains a metal heat exchanger 320 that facilitates the mounting of power hub 110 to a vehicle and serves to provide heat dissipation to cool internal power electronics.

The front surface 304 comprises three C1 connectors (e.g., C1A-C) that can connect up to three HV batteries onto the HVDC bus 112 of the power hub 110. The front surface 304 also comprises a motor connector 322 that is used to provide low-voltage power and control and communication signals to a vehicle motor and inverter. For example, power to the inverter 126 is provided from the HVDC bus 112. The right side surface 306 comprises a first system connector 316 and a second system connector 318 which provide low-voltage power and control and communication signals to other parts of the vehicle.

FIG. 4 is a diagram showing a rear view of the integrated power hub 110. In one embodiment, the rear surface 308 is angled to form rear surface portion 308A and rear surface portion 308B. The rear surface portion 308B comprises the AC connector 132 and five C3 connectors (e.g., C3A-E) that provide the HVDC bus 118 to vehicle systems external to the power hub 110, such as a high-voltage heater, a high-voltage refrigerant compressor, and a high-voltage accessory drive motor for powering hydraulics. The rear surface portion 308a also comprises the C2 connector that provides the HVDC bus 112 to vehicle systems external to the power hub 110 (such as charging station 102) to provide DC fast charge (DCFC) operation. The rear surface portion 308a also comprises a C4 connector and a C4 return (C4R) connector that couple the LVDC bus 122 to a low-voltage vehicle battery. The power hub 110 includes cooling connection points 402 and 404 that route coolant through cooling channels within the heat exchanger 320 to assist in cooling the power hub 110 and its internal components during operation.

Figure 5:
FIG. 5 is a table that identifies various connectors of the integrated power hub.

FIG. 5 is a table 500 that describes connectors of the integrated power hub 110.

Figure 6:
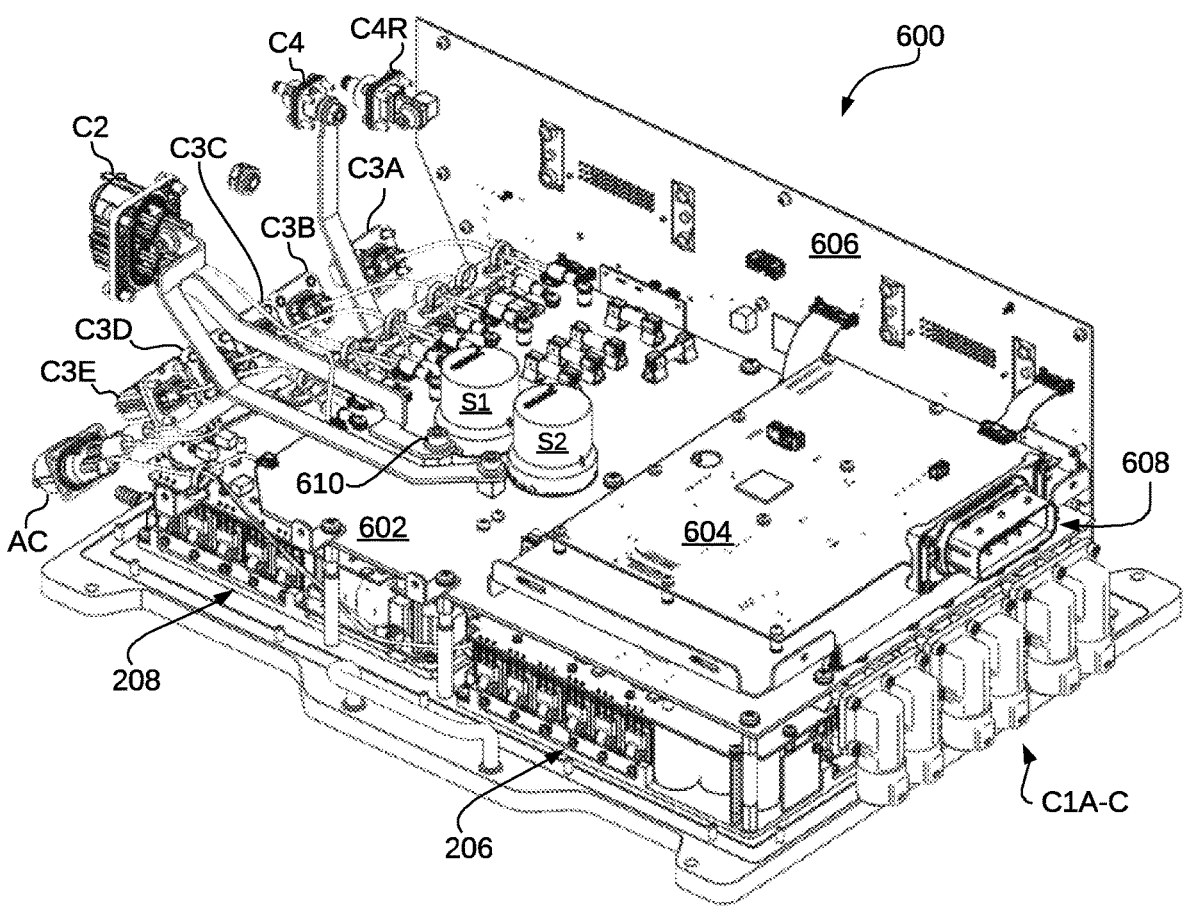
FIG. 6 is a diagram showing an internal view of an integrated power hub with the top cover removed.

FIG. 6 is a diagram showing an internal view of the integrated power hub 110 with the top cover removed. As illustrated in FIG. 6, with the top cover removed, the connectors AC, C1A-C, C2, C3A-E, C4 and C4R are visible. Circuit boards 602, 604 and 606 are also visible. The circuit board 602 is an HV circuit board that routes HV signals, including portions of the HVDC buses 112, 116 and 118 within the power hub 110. Mounted onto the board 602 are switches S1 and S2, which provide the functionality of the switch 210 shown in FIG. 2. The circuit board 604 provides motor low voltage power and control and is connected to the low voltage connector 608. The circuit board 606 contains controller 202 and routes low voltage power, ground and communication signals to connectors C4, C4R and low voltage communications signals to circuit boards 602 and 604.

In one embodiment, the PCB 602 is located directly on top of the converter modules allowing connections to be made using conductive mechanical standoffs (e.g., standoff 610) instead of wires. The PCB 602 also connects to the connectors C1a-c directly with bolts, not using wire or busbar, and thus saving on parts and reducing complexity. In addition, the controller board 606 is positioned perpendicular to the PCB 602 and located on the side of the enclosure so that it is out of the way and therefore allows more PCB real estate to fit within the enclosure. Also, the motor controller board 604 is stacked on top of the main PCB board 602 in order to get more PCB area into the enclosure.

Figures 7, 8:
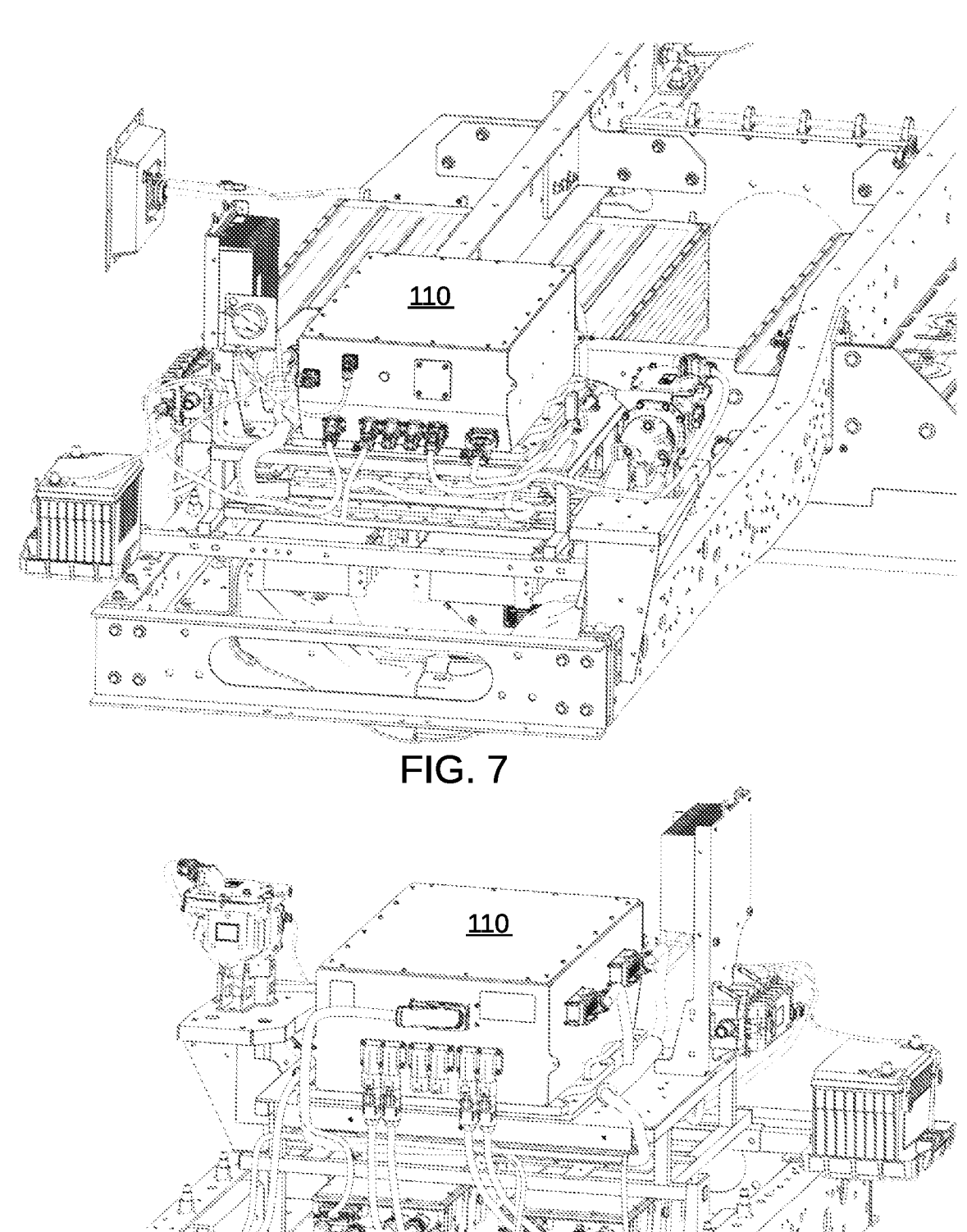
FIG. 7 is a diagram showing a front view of an integrated power hub mounted in a vehicle.
FIG. 8 is a diagram showing a rear view of an integrated power hub mounted in a vehicle.

FIG. 7 is a diagram showing a front view of the integrated power hub 110 mounted in a vehicle.

FIG. 8 is a diagram showing a rear view of the integrated power hub 110 mounted in a vehicle.

FIG. 9 is a flowchart of a method 900 for distributing power from a charging station in accordance with at least one novel aspect. For example, method 900 is suitable for use with the power hub 110.

At step 901, a determination is made as to whether the power hub is in charge mode. In charge mode, a charge station is connected to the vehicle. If the power hub is in charge mode, the method proceeds to step 902. If the power hub is not in charge mode, the method proceeds to step 908.

At step 902, a determination is made as to whether the power hub is in DC charge mode. In DC charge mode, a HVDC signal is provided to the power hub from a charging station. If the power hub is in DC charge mode, the method proceeds to step 902. If the power hub is not in DC charge mode, the method proceeds to step 905.

At step 903, HVDC power is received at a first connector of the power hub that is connected to the charging station. For example, HVDC power is received at the connector C2 shown in FIG. 2.

At step 904, the received HVDC power is connected to a HVDC bus through a switch. For example the HVDC bus 116 is connected to the HVDC bus 112 through the switch 210. The method then proceeds to step 907.

At step 905, AC power is received at an AC connector that is connected to the charging station. For example, AC power is received at the AC connector 132 from the charging station.

At step 906, the received AC power is converted to HVDC power. For example, the received AC power is converted to HVDC power by the AC to HVDC converter 208.

At step 907, the HVDC bus is connected to a second connector. For example, the HVDC bus 112 is connected to the connector C1.

At step 908, The HVDC power is distributed on an HVDC bus. For example, the HVDC power is distributed on the HVDC bus 112. A battery storing sourcing or sinking power may be connected to the HVDC bus via connector C1.

At step 909, the HVDC bus is connected to a third connector. For example, the HVDC bus 112 is connected to the connector C3.

At step 910, The HVDC power is converted to low voltage DC (LVDC) power. For example, the HVDC bus 112 provides HVDC power to the isolated HVDC-to-LVDC converter 206. The HVDC-to-LVDC converter 206 converts the HVDC power to LVDC power provided on a LVDC bus 122.

At step 911, The low voltage DC power is provided to a fourth connector that is attached to charge a battery. For example, the low voltage DC bus 122 is connected to the low voltage DC connector C4 which is connected to charge a battery.

Thus, method 900 operates to distribute power from a charging station using a power hub at a vehicle. It should be noted that the operations of method 900 are exemplary and not limiting and that in other embodiments, the operations of method 900 can be rearranged, added to, deleted, or otherwise modified within the scope of the embodiments.

FIG. 10 is a flowchart of a method 1000 for forming a power distribution hub in accordance with at least one novel aspect. For example, method 1000 is suitable for forming the power hub 110.

At step 1001, a hub enclosure is formed. For example, the hub enclosure of the power hub 110 is formed as illustrated in FIG. 3 and FIG. 4. The hub enclosure may include a provision for heat transfer through the hub enclosure. One example of a heat transfer provision is a cold plate with liquid coolant flowing through it, such as heat exchanger 320, or with fins connected to the cold plate to facilitate heat transfer. Another example of a heat transfer provision is a channel in the hub enclosure itself through which a liquid or two-phase coolant flows. Another example of a heat transfer provision is a feature on the hub enclosure which increases surface area exposed to a cooling fluid such as air to facilitate heat transfer, such as a pin or fin structure.

At step 1002, connectors are mounted to the hub enclosure. For example, the AC connector 132 and connectors C1 through C4 are mounted to the hub enclosure. In and embodiment the CAN bus connector 221 is also mounted to the hub enclosure.

At step 1003, an AC-to-HVDC converter is mounted to the base of the hub enclosure. For example, the AC-to- HVDC converter 208 is mounted to the base of the Hub enclosure. The AC-to-HVDC converter may be thermally coupled to the hub enclosure or to a thermal transfer provision within the hub enclosure to facilitate heat transfer away from the AC-to-HVDC converter.

At step 1004, an HVDC-to-LVDC converter is mounted to the base of the hub enclosure. For example, the HVDC-to-LVDC converter 206 is mounted to the base of the hub enclosure. The HVDC-to-LVDC converter 206 may be thermally coupled to the hub enclosure or to a thermal transfer provision within the hub enclosure to facilitate heat transfer away from the HVDC-to-LVDC converter.

At step 1005, a main PC board is mounted on top of the two converters using conductive standoffs that pass control signals. For example, as illustrated in FIG. 6, the main PC board 602 is mounted on top of the two converters using conductive standoffs, such as standoff 610.

At step 1006, A motor control board is mounted on top of the main PC board. For example, as illustrated in FIG. 6, the motor control board 604 is mounted on top of the main PC board 602.

At step 1007, a control board is mounted within the hub enclosure and perpendicular to the main PC board to conserve space. For example, the control board 606 is mounted within the hub enclosure and perpendicular to the main PC board 602.

At step 1008, an AC connector is connected to the AC-to-HVDC converter. For example, the AC connector 132 is connected to the AC-to-HVDC converter 208.

At step 1009, a HVDC bus is connected to the AC-to-HVDC converter. For example, the HVDC bus 112 is connected to the AC-to-HVDC converter 208.

At step 1010, a first connector is connected to the HVDC bus through a switch. For example, the connector C2 is connected to the HVDC bus 112 through the switch 210.

At step 1011, a second connector is connected to the HVDC bus. For example, the second connector C1 is connected to the HVDC bus 112.

At step 1012, a third connector is connected to the HVDC bus through a fuse. For example, the connector C3 is connected to the HVDC bus 112 through the fuse 214.

At step 1013, the HVDC bus is connected to a HVDC-to-LVDC converter. For example, the HVDC bus 112 is connected to the isolated HVDC-to-LVDC converter 206

At step 1014, a LVDC bus is connected to a battery connector. For example, a LVDC bus 122 carries LVDC power to the connector C4. The connectors C4 and C4r are connected to a vehicle battery.

At step 1015, A heat exchanger is mounted to the base of the hub enclosure. For example, as illustrated in FIG. 3, the heat exchanger 320 is mounted to the base of the hub 110 to provide thermal cooling.

Thus, method 1000 operates to form a power distribution hub for use in a vehicle. It should be noted that the operations of method 1000 are exemplary and not limiting and that in other embodiments, the operations of method 1000 can be rearranged, added to, deleted, or otherwise modified within the scope of the embodiments.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An enclosure comprising:

an Alternating Current (AC) connector mounted to the enclosure that connects to an AC voltage network;

a first power converter that converts power between the AC voltage network and a high-voltage direct current (HVDC) bus;

a second power converter that converts power between the HVDC bus and a low-voltage DC (LVDC) bus;

a first HVDC connector mounted to the enclosure that is connected to the HVDC bus;

a second HVDC connector mounted to the enclosure that is connected to the HVDC bus through a switch;

a third HVDC connector mounted to the enclosure that is connected to the HVDC bus through a current-limiting device; and a first LVDC connector mounted to the enclosure that is connected to the LVDC bus.

2. The enclosure of claim 1, further comprising:

a voltage sensor that measures voltage on the second HVDC connector.

3. The enclosure of claim 2, further comprising:

a controller, wherein the controller controls the first and second power converters, reads the voltage sensor, and communicates with a controller outside the enclosure using a Controller Area Network (CAN) bus.

4. The enclosure of claim 3, wherein a state of the current-limiting device is sensed by the controller.

5. The enclosure of claim 1, wherein each of the first and second HVDC connectors sustains a current level that is at least twice as large as a current level sustained by the third HVDC connector.

6. The enclosure of claim 1, wherein the first HVDC connector carries at least 100 amperes, wherein the second HVDC connector carries at least 200 amperes, and wherein the third HVDC connector carries less than 50 amperes.

7. The enclosure of claim 1, wherein the first HVDC connector does not couple to any current-limiting device internal to the enclosure.

8. The enclosure of claim 1, wherein the HVDC bus operates at a voltage level over 60V and the LVDC bus operates at a voltage level under 60V.

9. The enclosure of claim 1, wherein the current-limiting device is at least one of a fuse, a circuit breaker, an electronic fuse, a switch, or a solid-state device.

10. The enclosure of claim 1, wherein the switch is at least one of a contactor, a relay, or a transistor.

11. The enclosure of claim 1, further comprising:

a current sensor that measures a current flowing through the LVDC bus.

12. The enclosure of claim 1, further comprising:

a high-voltage interlock circuit that indicates whether or not one or more of the first, second, and third HVDC connectors is connected or disconnected.

13. The enclosure of claim 12, wherein the second power converter operates to reduce the voltage on the HVDC bus when the high-voltage interlock circuit indicates one or more of the first, second, and third HVDC connectors is disconnected.

14. The enclosure of claim 12, wherein a power dissipation element reduces the voltage on the HVDC bus when the high-voltage interlock circuit indicates one or more of the first, second, and third HVDC connectors is disconnected.

15. The enclosure of claim 1, wherein the enclosure maintains an ingress protection (IP) rating.

16. The enclosure of claim 15, wherein the IP rating is greater than IP22.

17. The enclosure of claim 1, further comprising:

a heat exchanger.

18. The enclosure of claim 17, further comprising:

cooling connection points configured to route coolant through cooling channels within the heat exchanger.

* * * * *